(12) United States Patent
Steffan

(10) Patent No.: US 6,174,739 B1
(45) Date of Patent: Jan. 16, 2001

(54) METHOD OF MONITORING VIA AND TRENCH PROFILES DURING MANUFACTURE

(75) Inventor: Paul J. Steffan, Elk Grove, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/345,156

(22) Filed: Jun. 30, 1999

(51) Int. Cl.$^7$ ....................................................... H01L 21/00
(52) U.S. Cl. ................................................................ 438/7
(58) Field of Search ................................................... 438/7

(56) References Cited

U.S. PATENT DOCUMENTS

| | | |
|---|---|---|
| 4,522,510 | 6/1985 | Rosencwaig et al. . |
| 4,747,698 * | 5/1988 | Wickramasinghe et al. . |
| 5,504,017 * | 4/1996 | Yue et al. . |
| 5,548,404 * | 8/1996 | Kupershmidt et al. . |
| 5,757,502 * | 5/1998 | Weling . |
| 5,812,261 * | 9/1998 | Nelson et al. . |
| 5,900,644 * | 5/1999 | Ying et al. . |

OTHER PUBLICATIONS

Chang & Sza, Editors, ULSI Technology, 1996, McGraw–Hill, pp. 627–629.*

* cited by examiner

Primary Examiner—Charles Bowers
Assistant Examiner—Evan Pert
(74) Attorney, Agent, or Firm—H. Donald Nelson

(57) ABSTRACT

A method of nondestructively monitoring filled or unfilled via and trench profiles during the manufacture of semiconductor devices. A selected filled or unfilled via or trench is scanned with overlapped excitation pulses that form a temporally varying excitation radiation field causing a time-dependent ripple to be generated that is irradiated by a probe pulse that diffracts into at least two signal beams. One of the diffracted signal beams is detected and digitized to produce a digitized waveform signal that is analyzed in a CPU to obtain a frequency of the digitized waveform signal and is compared to characterization waveforms stored in a database to determine the profile of the selected filled or unfilled via or trench.

8 Claims, 11 Drawing Sheets

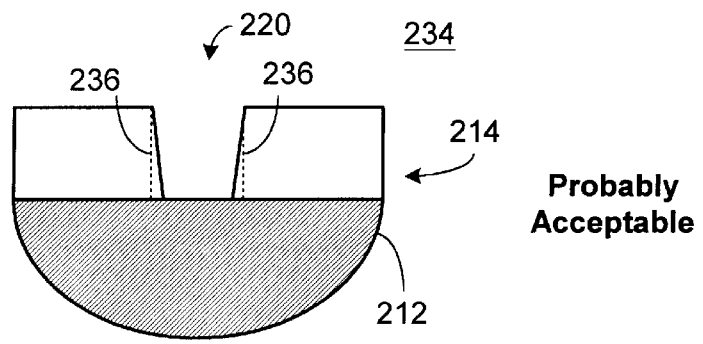
FIGURE 3B — Probably Acceptable
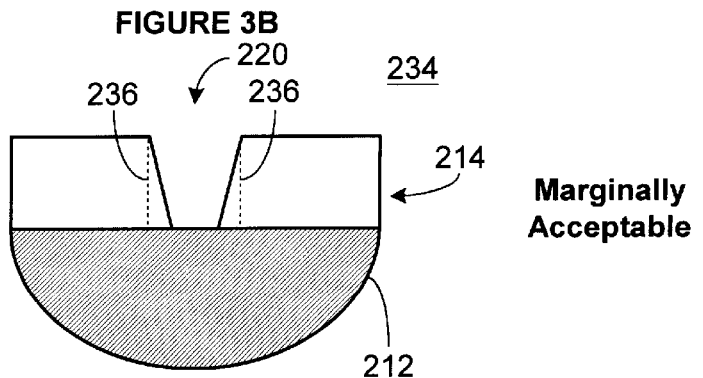
FIGURE 3C — Marginally Acceptable
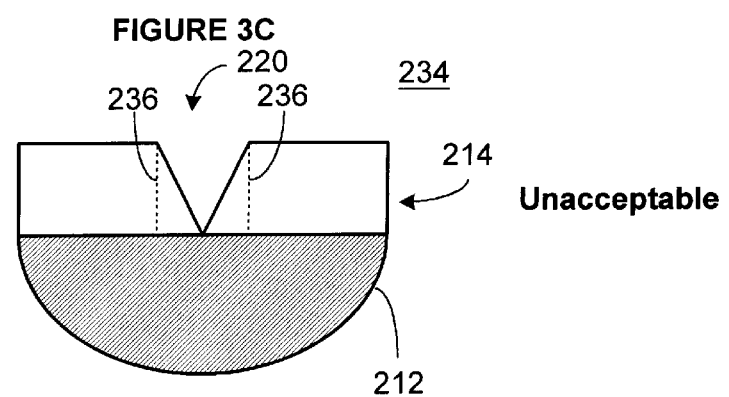
FIGURE 3D — Unacceptable
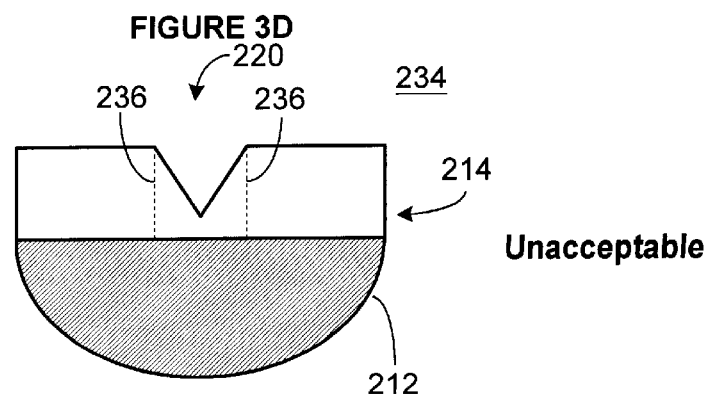
FIGURE 3E — Unacceptable

US 6,174,739 B1

METHOD OF MONITORING VIA AND TRENCH PROFILES DURING MANUFACTURE

BACKGROUND OF THE INVENTION

1. Field of the Invention

This invention relates generally to the manufacture of high performance semiconductor devices. More particularly, this invention relates to a method of monitoring the profiles of filled or unfilled trenches or vias during the manufacturing process. Even more particularly, this invention relates to a non-destructive in-situ method of monitoring the profiles of filled or unfilled trenches or vias during the manufacturing process.

2. Discussion of the Related Art

The increased demand for higher performance semiconductor devices has required more complex process technologies and materials to be utilized in the manufacture of semiconductor integrated devices. One way to increase the performance of a semiconductor integrated device such as a microprocessor is to reduce the dimensions of the elements that make up the microprocessor. The reduced dimensions have increased the performance of the microprocessor significantly to the point that the interconnect structure of the microprocessor has proved to be a roadblock to a further increase in performance. One reason for this is because as increased performance is required, more transistors need to be manufactured in the semiconductor-integrated device. These added transistors require more wiring in the interconnect structure. The increased density of the wiring can result in a decrease in the microprocessor performance for various reasons including such phenomena as a decrease in performance due to RC delays. In order to support the increased transistors and to counteract the degradation in performance, additional metal layers in which interconnects are formed are manufactured in order to separate the wiring in both the vertical and horizontal directions. As can be appreciated, each metal layer requires an interconnect structure made up of vias (metal connections between layers) and wires (metal connections in a layer).

These requirements have necessitated the development of novel approaches in the method of forming interconnections that not only integrate fine geometry definition but also can be efficiently implemented into the manufacturing process.

One method of forming a via or a trench in which a wire is formed is known as the damascene process, which comprises forming a hole or trench in an interlayer dielectric material by a masking and etching technique and by a subsequent filling of the hole or trench with a conductive material. The damascene process is a useful method for attaining the fine geometry metallization required for advanced semiconductor devices. A dual damascene process is a two-step sequential mask/etch process to form a two level structure such as a via connected to a metal line above the via.

However, the dimensions of the vias and the trenches have been reduced to the point that conventional inspection devices cannot determine if the openings for the vias and trenches are fully "open" or if the quality of the electrical contacts that will be formed in the openings will be adequate for the purpose for which they are intended. For example, FIGS. 3A–3E show various conditions of openings possible after an etch process to form an opening in a layer of interlayer dielectric. FIG. 3A shows the ideal condition of an opening and FIGS. 3B through 3E show conditions of openings that begin with conditions that are less than ideal but acceptable to conditions that are unacceptable. Because conventional inspection techniques cannot determine the condition of the openings, the manufacturing process continues and if there are unacceptable conditions they will not be discovered until the wafers have been completely processed. As can be appreciated, this results in a large waste of resources.

Therefore, what is needed is a nondestructive method of inspecting the condition of openings formed in layers of interlayer dielectric and alternatively, a nondestructive method of inspecting the condition of metal structures formed in the openings formed in layers of interlayer dielectric.

SUMMARY OF THE INVENTION

According to the present invention, the foregoing and other objects and advantages are obtained by a method of manufacturing in which filled or unfilled via and trench profiles are nondestructively monitored during the manufacturing process.

In accordance with an aspect of the invention, a layer of an interlayer dielectric is formed on a surface of a semiconductor device, at least one opening is formed in the layer of interlayer dielectric and the profile of the at least one opening is determined.

In accordance with another aspect of the invention, it is determined if the profile of the at least one opening is acceptable. If the profile is acceptable, the processing is continued. If the profile is not acceptable, the profile is analyzed and the manufacturing recipe is modified.

In accordance with another aspect of the invention, the at least one opening is filled with a metal to form a metal structure and the profile of the metal structure is determined.

In accordance with still another aspect of the invention, it is determined if the profile of the metal structure is acceptable. If the profile is acceptable, the processing is continued. If the profile is not acceptable, the profile is analyzed and the manufacturing recipe is modified.

In accordance with another aspect of the invention, the profiles of either the opening or the metal structure is accomplished by scanning the opening or the metal structure with overlapped excitation pulses that form a temporally varying excitation radiation field causing a time-dependent ripple to be generated that is irradiated by a probe pulse that diffracts into at least two signal beams. One of the diffracted signal beams is detected and digitized to produce a digitized waveform signal that is analyzed in a CPU to obtain a frequency of the digitized waveform signal and is compared to characterization waveforms stored in a database to determine the profile of the selected filled or unfilled via or trench.

The described methods thus provide a nondestructive method of monitoring the profiles of filled or unfilled trenches and vias during the manufacturing process. This results in less scrap and less waste of valuable resources.

The present invention is better understood upon consideration of the detailed description below, in conjunction with the accompanying drawings. As will become readily apparent to those skilled in the art from the following description, embodiments of this invention are shown and described simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 3A through 3E illustrate the conditions of an opening after an etch process of an interlayer dielectric dig the formation of either a via or a wire;

DETAILED DESCRIPTION

Reference is now made in detail to specific embodiments of the present invention that illustrate the best mode presently contemplated by the inventor for practicing the invention.

Figure 1:
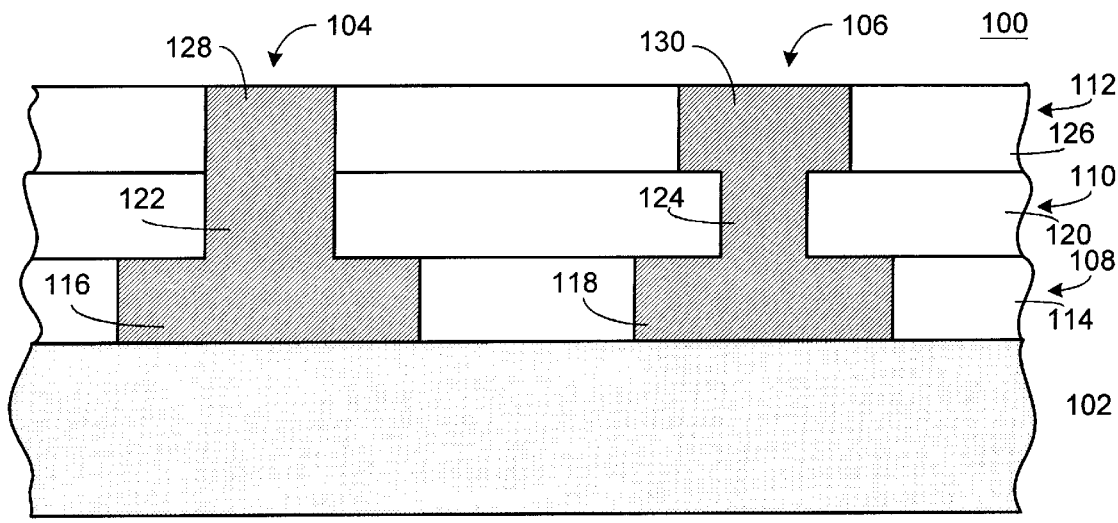
FIG. 1 shows a portion of a semiconductor device showing two metal structures extending through three layers of interlayer dielectric.

FIG. 1 shows a portion 100 of a semiconductor device. The portion 100 of the semiconductor device is formed in and on a semiconductor substrate 102. Active semiconductor devices (not shown) are typically formed in and on the semiconductor substrate 102 and metal structures such as the ones shown at 104 and 106 are formed to electrically connect an electrode (not shown) of an active component (not shown) in the substrate 102 to a structure in another portion of the substrate 102. The portion 100 of the semiconductor device is shown with three layers 108, 110 and 112. The first layer 108 is made up of a first layer of interlayer dielectric 114. A first portion 116 of the metal structure 104 in the first layer of interlayer dielectric 108 can be a wire or a via. Similarly, 110 a first portion 118 of the metal structure 106 in the first layer of interlayer dielectric 108 can be a wire or a via. As is known in the semiconductor manufacturing art, a wire typically is formed in a singe layer and thus could have dimensions into and out of the plane of the figure. A via is typically a connection from one layer to the next and would not extend into or out of the plane of the figure to any great extent.

The second layer 110 is made up of a second layer of interlayer dielectric 120. A second portion 122 of the metal structure 104 in the second layer of interlayer dielectric 120 can be a wire or a via. Similarly, a second portion 124 of the metal structure 106 in the second layer of interlayer dielectric 110 can be a wire or a via.

The third layer 112 is made up of a third layer of interlayer dielectric 126. A third portion 128 of the metal structure 104 in the third layer of interlayer dielectric 112 can be a wire or a via. Similarly, a third portion 130 of the metal structure 106 in the third layer of interlay dielectric 112 can be a wire or a via.

Figure 2A:
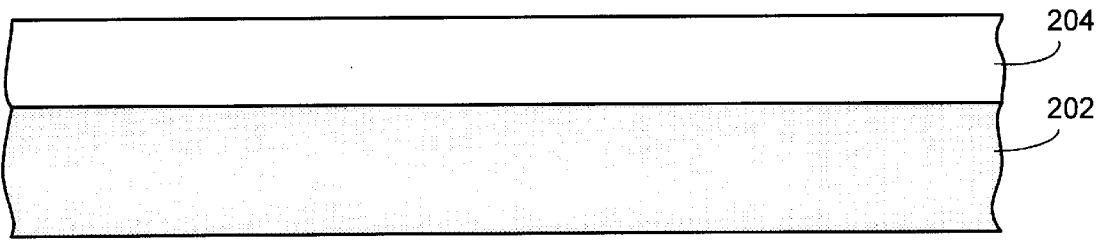
FIGS. 2A through 2O illustrate the steps necessary to manufacture the portion of the semiconductor device shown in FIG. 1.

FIG. 2A through FIG. 2P illustrate the steps necessary to manufacture the semiconductor device shown in FIG. 1. FIG. 2A shows a portion 200 of a semiconductor device. As is known in the semiconductor manufacturing art, semiconductor devices are manufactured on and in wafers that are made up of a semiconductor substrate 202 on and in which active semiconductor components (not shown) such as transistors are formed. The active semiconductor components have electrodes, such as sources, drains and gates that must be connected to electrodes of other semiconductor devices in the wafer. Because of the number of active semiconductor components that are formed in the semiconductor devices it has become necessary to manufacture multiple layers in order to accommodate the wires necessary to make the multiple interconnections between the active semiconductor components. After the active semiconductors have been formed in the semiconductor substrate 202, a first layer 204 of interlayer dielectric is formed on the surface of the semiconductor substrate 202. The interlayer dielectric is formed of a material such as silicon dioxide.

Figure 2B:
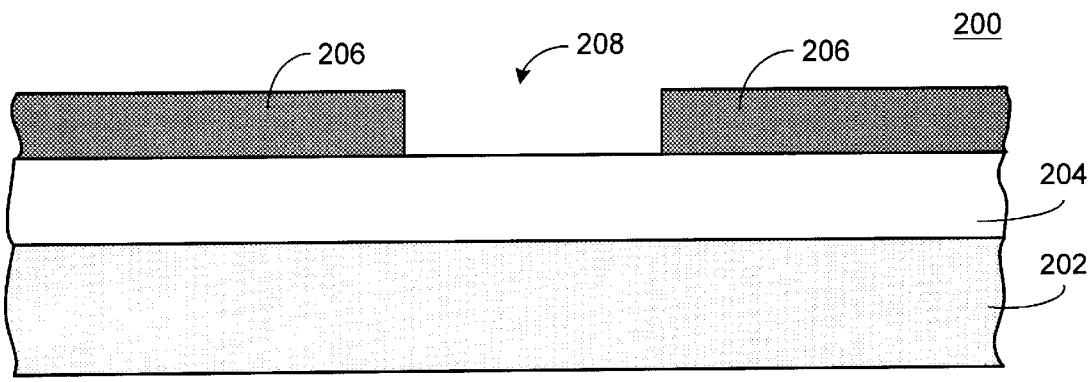

FIG. 2B shows the structure shown in FIG. 2A with a layer of photoresist 206 formed on the surface of the first layer 204 of interlayer dielectric. The layer of photoresist 206 is shown patterned and developed to expose portions that are to be etched, such as that shown at 208, of the underlying first layer 204 of interlayer dielectric.

Figure 2C:
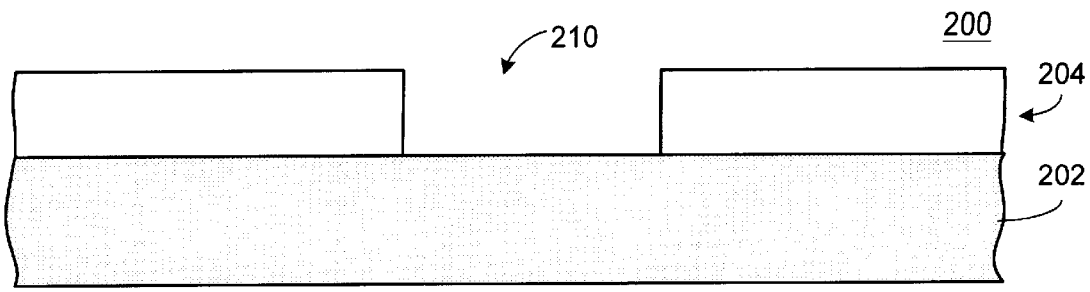

FIG. 2C shows the structure shown in FIG. 2B with the first layer 204 of interlayer dielectric etched to form the opening 210.

Figure 2D:
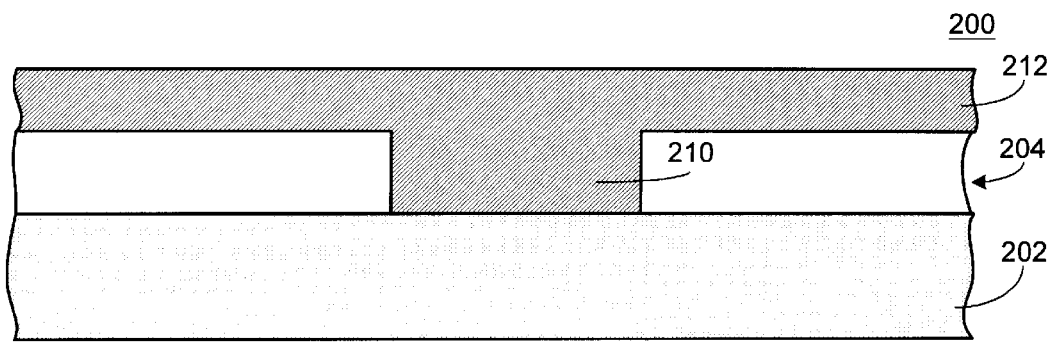

FIG. 2D shows the structure shown in FIG. 2C with a layer 212 of metal formed on the surface of the structure that covers the remaining portions of the first layer 204 of interlayer dielectric and that fills the opening 210 in the first layer 204 of interlayer dielectric.

Figure 2E:
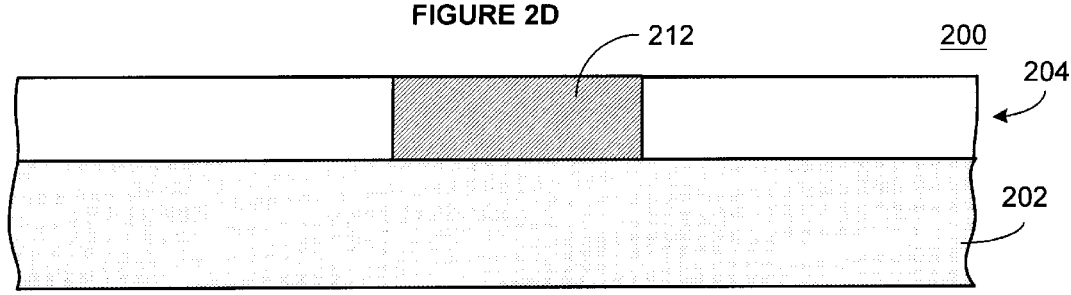

FIG. 2E shows the structure shown in FIG. 2D with the layer 212 of metal planarized down to the surface of the remaining portions of the first layer 204 of interlayer dielectric. The remaining portion 212 of metal forms an electrical connection to an electrode (not shown) in the semiconductor substrate 202.

Figure 2F:
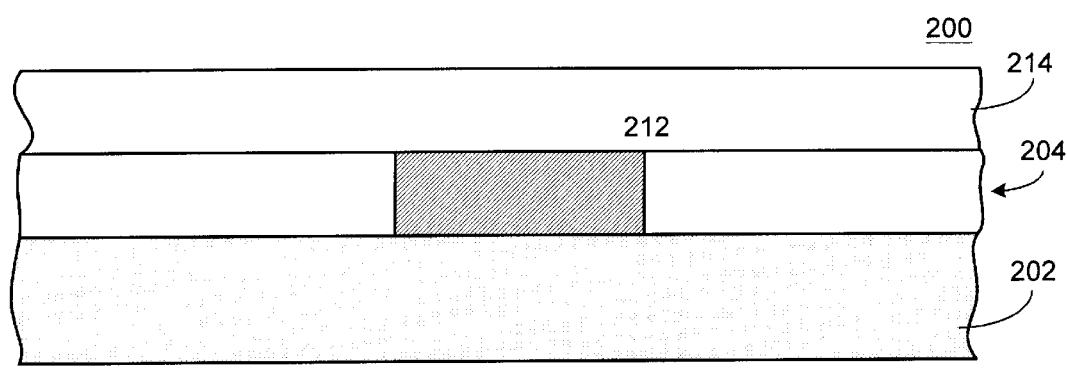

FIG. 2F shows the structure shown in FIG. 2E with a second layer 214 of interlayer dielectric formed on the surface of the structure shown in FIG. 2E.

Figure 2G:
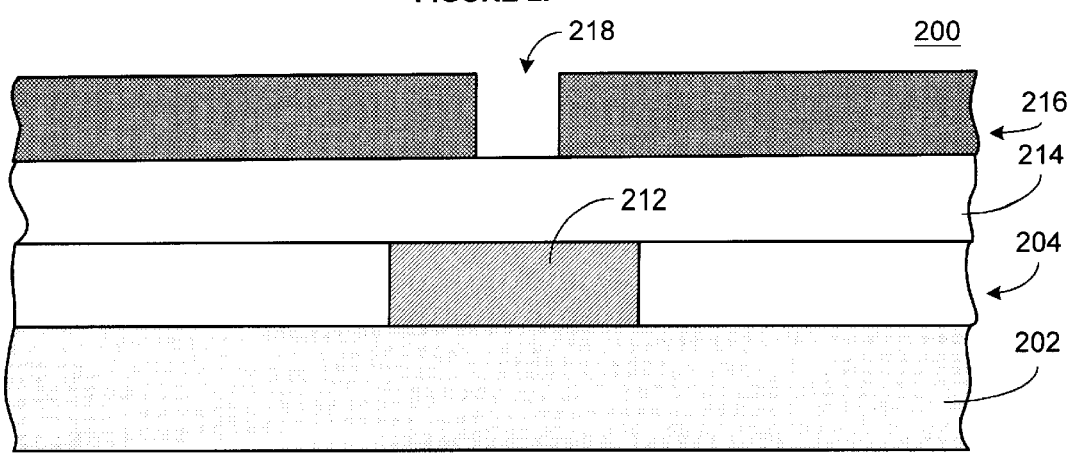

FIG. 2G shows the structure shown in FIG. 2F with a second layer 216 of photoresist formed on the surface of the structure, patterned and developed to expose portions of the underlying second layer 214 of interlayer dielectric that are to be etched, such as the portion 218.

Figure 2H:
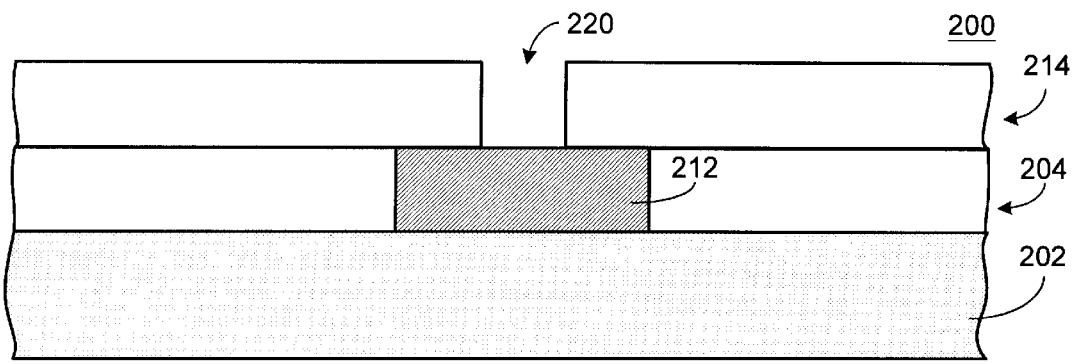

FIG. 2H shows the structure shown in FIG. 2G with the second layer 214 of interlayer dielectric etched to form opening 220 in the second layer 214 of interlayer dielectric.

Figure 2I:
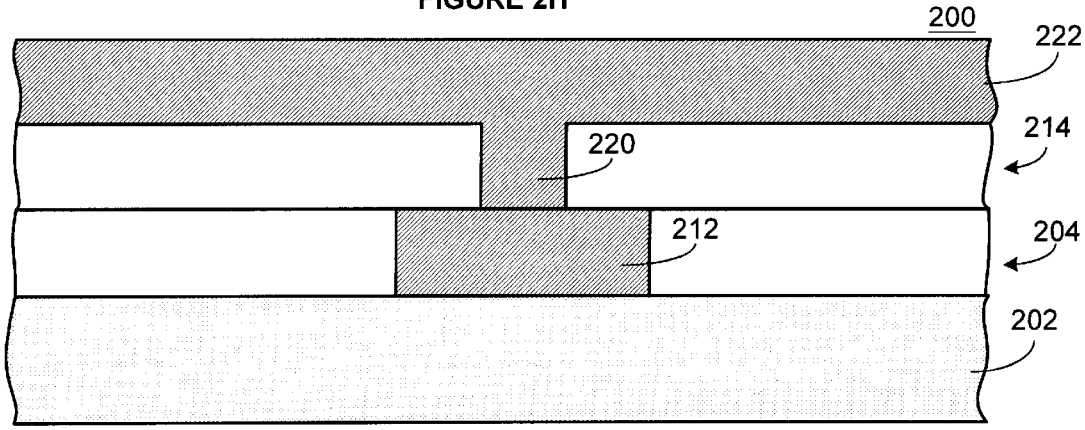

FIG. 2I shows the structure shown in FIG. 2H with a second layer 222 of metal formed on the structure as shown in FIG. 2H. The second layer 222 of metal is formed over the remaining portions of the second layer 214 of interlayer dielectric and fills the opening 220.

Figure 2J:
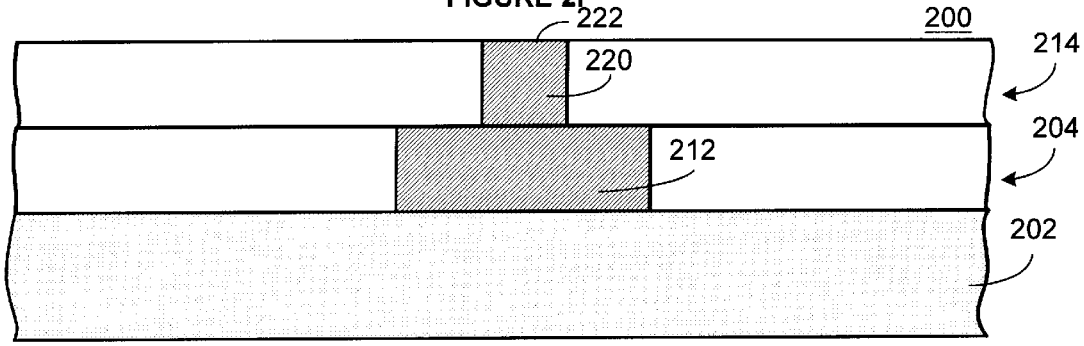

FIG. 2J shows the structure shown in FIG. 2I with the second layer 222 of metal planarized down to the surface of the second layer 214 of interlayer dielectric. The remaining second layer 222 of metal forms a metal structure in the opening 220.

Figure 2K:
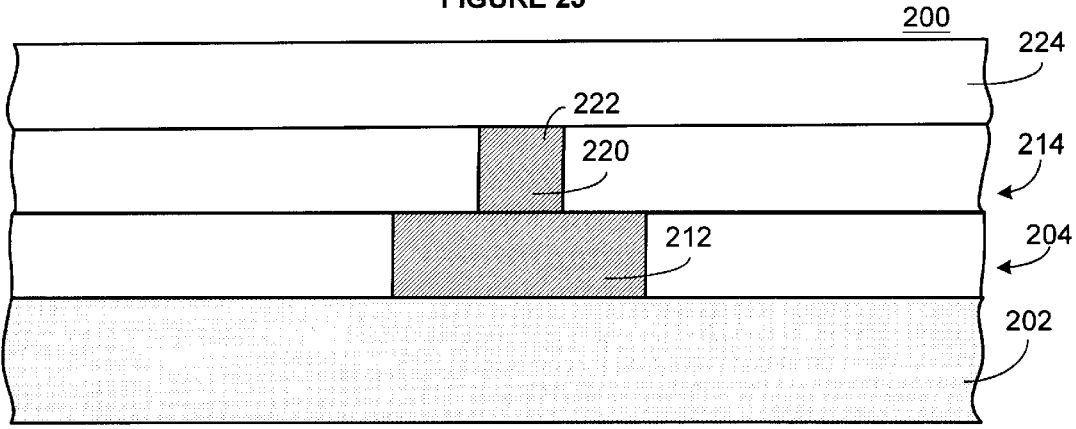

FIG. 2K shows the structure shown in FIG. 2J with a third layer 224 of interlayer dielectric formed on the surface of the structure as shown in FIG. 2J.

Figure 2L:
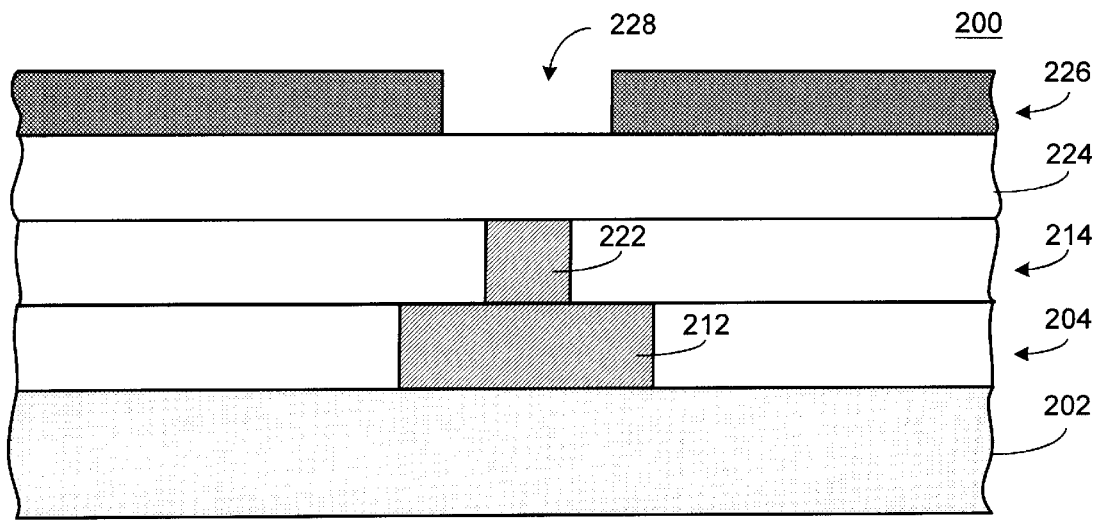

FIG. 2L shows the structure shown in FIG. 2K with a third layer 226 of photoresist formed on the surface of the structure as shown in FIG. 2L. The third layer 226 of photoresist is patterned and developed to expose a portion 228 of the third layer 224 of interlayer dielectric.

Figure 2M:
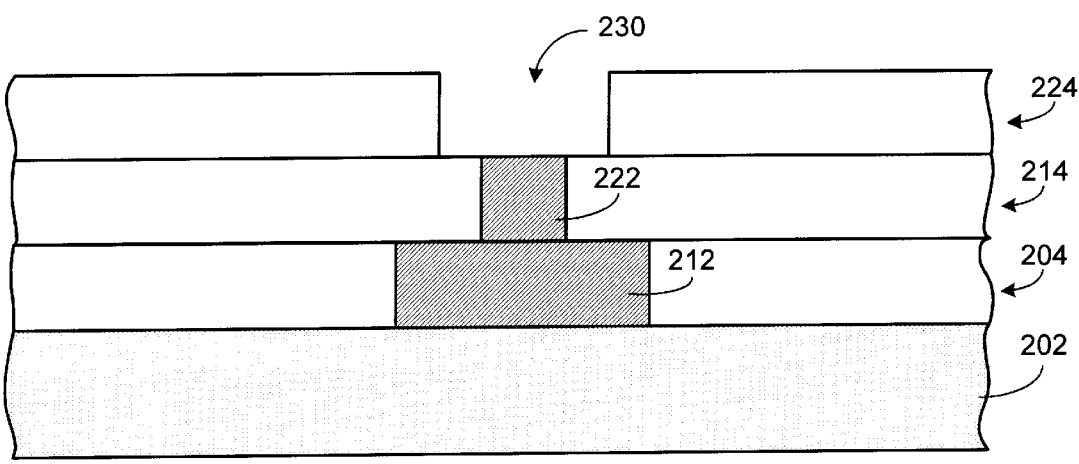

FIG. 2M shows the structure shown in FIG. 2L with the third layer 226 of photoresist removed and an opening 230 etched in the third layer 224 of interlayer dielectric.

Figure 2N:
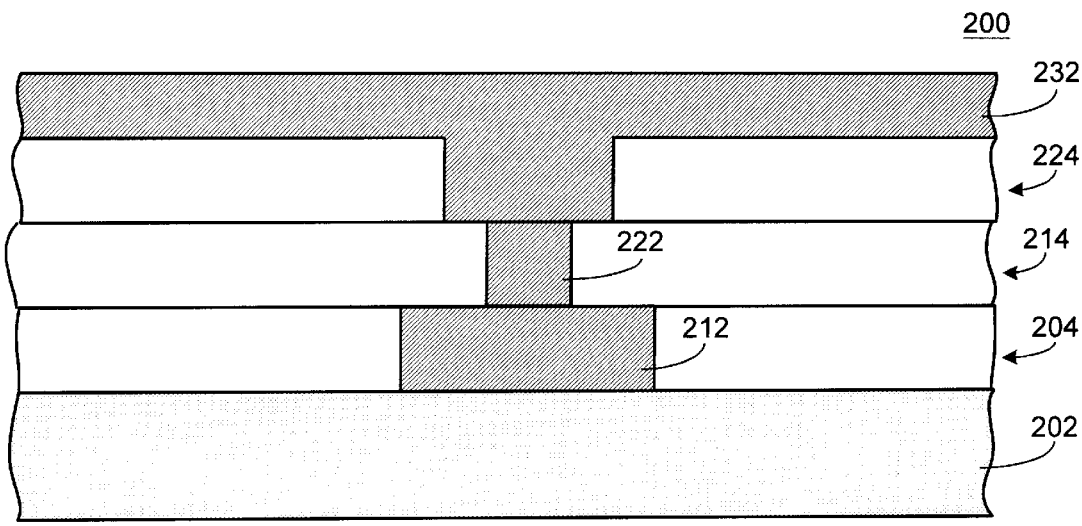

FIG. 2N shows the structure shown in FIG. 2M with a third layer 232 of metal formed on the surface of the structure as shown in FIG. 2M. The third layer 232 of metal fills the opening 230.

Figure 2O:
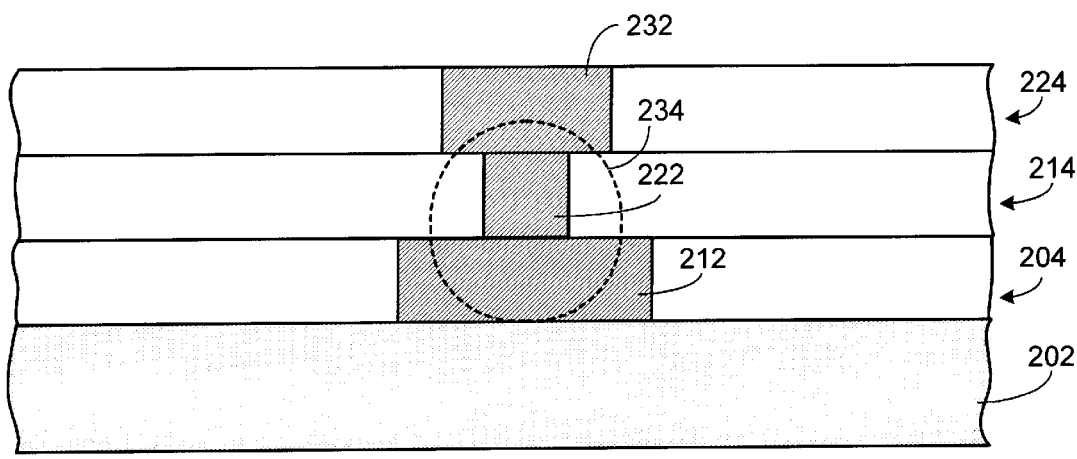

FIG. 2O shows the structure shown in FIG. 2N with the third layer 232 of metal planarized down to the surface of the third layer 224 of interlayer dielectric. The portion 234 of the metal structure within the dashed circle will be discussed below.

FIGS. 3A–3E show various conditions of the portion 222 of the metal structure shown in FIG. 2O. As can be appreciated the metal structure portion 222 must be formed as designed or the semiconductor device will not function as designed. For example, if the metal structure is narrower than designed a hot spot can be established that can cause the device to eventually fail. Also, as can be appreciated, if the metal structure portion 222 does not extend to the underlying metal structure 212 (FIG. 2O), there will be an open electrical connection.

Figure 3A:
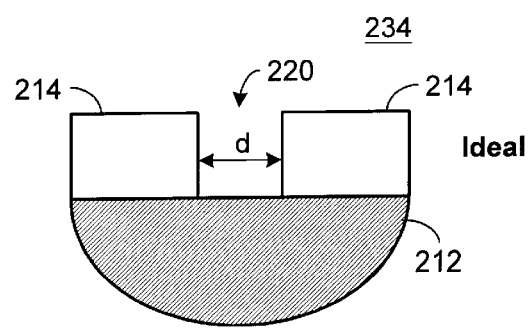

FIG. 3A shows the portion 234 of the structure after an etch operation that forms the opening 220 in an i deal condition. The ideal condition is when the opening 220 is formed with the maximum dimension d open t o the surface of the meta l structure 212.

FIG. 3B shows the portion 234 of the structure after an etch operation that forms the opening 220 in less than an ideal condition t hat may probably be acceptable. As shown, the dimension of the opening 220 at the interface with metal structure 212 is less than the optimal dimension d. The ideal dimension of the opening 220 is shown in dashed outline 236. As shown, the condition is probably acceptable.

FIG. 3C shows the portion 234 of the structure after an etch operation that forms the opening 220 in less than an ideal condition that is marginally acceptable. As shown, the dimension of the opening 220 at the interface with metal structure 212 is consideraby less than the ideal dimension as indicated by dashed lines 236 and as such is probably unacceptable.

FIG. 3D shows the portion 234 of the structure after an etch operation that forms the opening 220 in less than an ideal condition that is definitely unacceptable. As shown, the dimension of the opening 220 at the interface with metal structure 212 is essentially zero and as such is definitely unacceptable.

FIG. 3E shows the portion 234 of the structure after an etch operation that forms the opening 220 in less than an ideal condition that is definitely unacceptable. As shown, the etch operation has not reached the surface of the underlying metal layer 212 and as such is definitely unacceptable.

As discussed above, each of the conditions discussed in FIGS. 3A–3E appear to be easily determinable. However, because the dimensions of the devices and of the openings have become so small, the conditions of the openings cannot be determined unless the device is destroyed by making cross-sectional slices of the device for examination.

Figure 4:
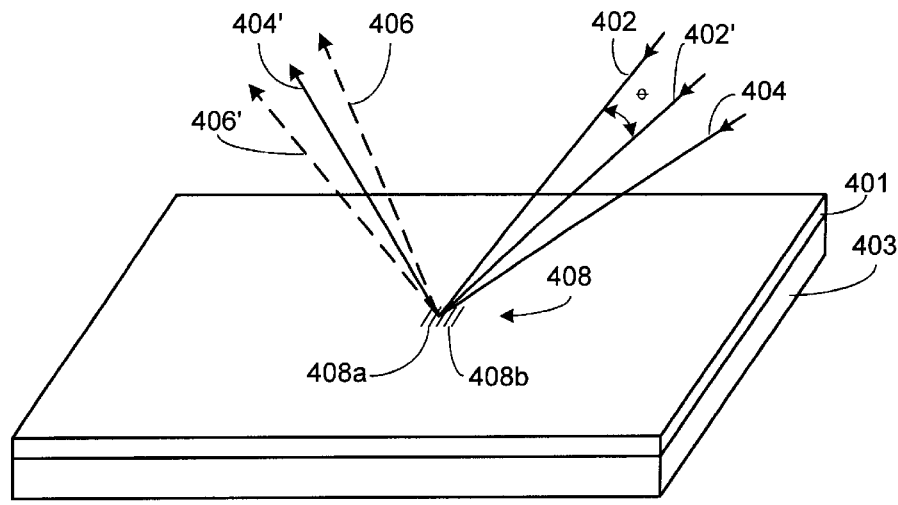
FIG. 4 illustrates a method of determining the thickness of either an opaque or transparent film as shown in the prior art.

FIG. 4 illustrates a prior art method and device for measuring the thickness of opaque and transparent films as described in U.S. Pat. No. 5,812,261 issued to Nelson et al. and which is incorporated herein in its entirety. A thickness of thin film 401 on a substrate 403 is measured by irradiating the film 401 with two excitation pulses 402 and 402' and a probe pulse 404. The excitation pulses 402 and 402' are short in duration, for example less than 1 nanosecond, are of the same wavelength, and are separated by an angle θ; the probe pulse 404 is relatively long, for example several hundred microseconds. In this conventional four-wave mixing geometry, the excitation pulses are overlapped in time and space so that they interfere to form a spatially and temporally varying excitation radiation field 408 in or on the surface of the film 401. The field 408 is composed of a series of periodic, sinusoidal "bright" 408a (constructive interference) and "dark" 408b (destructive interference) regions. The direction of the field is defined by a wavevector that is inversely proportional to the spatial distance between consecutive bright (or dark) regions. The excitation radiation field 408 excites acoustic waveguide modes in the film 401 that have a wavelength and orientation corresponding to the excitation wavevector.

Excitation of the waveguide modes occurs via Impulsive Stimulated Thermal Scattering (ISTS), a technique that relies upon the bright regions of the excitation radiation field 408 being absorbed by the film. Heat is deposited in the film during the short duration of the pulse, causing the heated regions of the film to thermally expand. This launches coherent, counter-propagating acoustic waveguide modes having a velocity that is proportional to the mode's frequency divided by the excitation wavevector. The waveguide modes induce a morphology in the film that generates a time-dependent "ripple" on the film's surface. The frequency of the ripple oscillations depends on the thickness of the film.

The probe pulse 404 has a duration that is longer than the lifetime of the acoustic waveguide mode. During operation, the probe pulse 404 irradiates the ripple induced on the surface of the film and diffracts to form at least two signal beams 406 and 406'. The ripple modulates each signal beam according to the time dependence of the acoustic waveguide modes. Beam 404' is the continuation of probe beam 404.

Figure 5A:
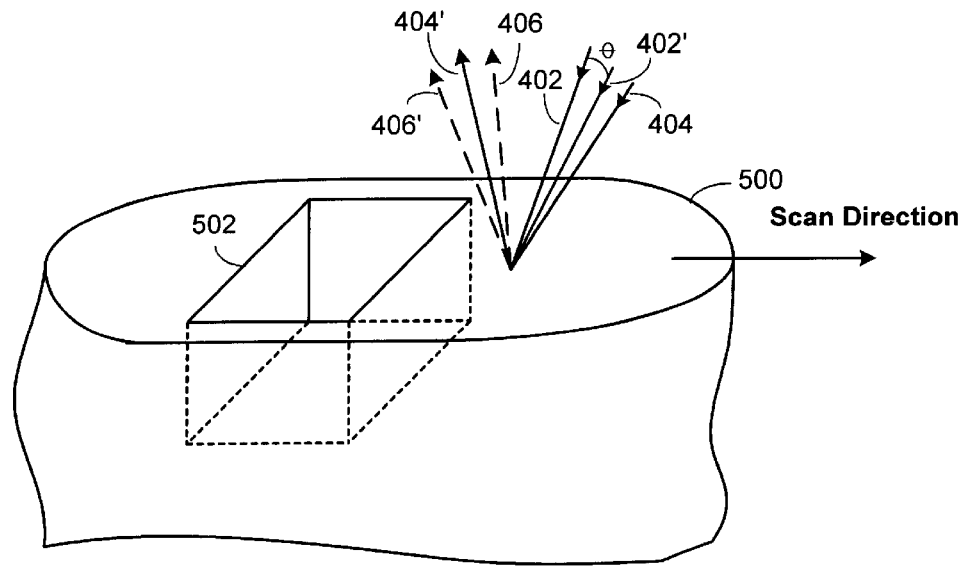
FIG. 5A illustrates the method of determining a thickness profile in accordance with the present invention.

FIG. 5A illustrates the technique of the present invention. The semiconductor device 500 in which openings such as the trench 502 have been formed is spatially translated so that a thickness measuring device such as the one described above scans the surface on either side of the trench and scans the trench 502. As described above, the waveguide modes induce a morphology in the film that generates a time-dependent "ripple" on the film's surface and the frequency of the ripple oscillations depends on the thickness of the film. The ripple modulates each signal beam according to the time dependence of the acoustic waveguide modes. One of these beams is detected using a high-bandwidth photodetector 504 (FIG. 5B) to generate a light-induced signal 506 that is digitized with a high-bandwidth analog-to-digital converter 508 to produce a digitized waveform signal 510 that is compared in CPU 512 to data that has been determined in a characterization process that is conducted on characterization wafers. The characterization process is a process in which data is collected by scanning test wafers, determining the output from scanning various openings or scanning various metal structures that fill the various openings and then correlating the scanning data to actual data obtained by destructively examining the conditions of the various openings and filled openings. For example, the scanning data from scanning an ideal opening (FIG. 3A) would be part of the database used by CPU 512 to determine the profile at 514. Thus, whenever the CPU detects that an output that is the same or similar to output in the database, the CPU would then generate a profile of the opening or metal structure. This profile is then output at 514.

Figure 5B:
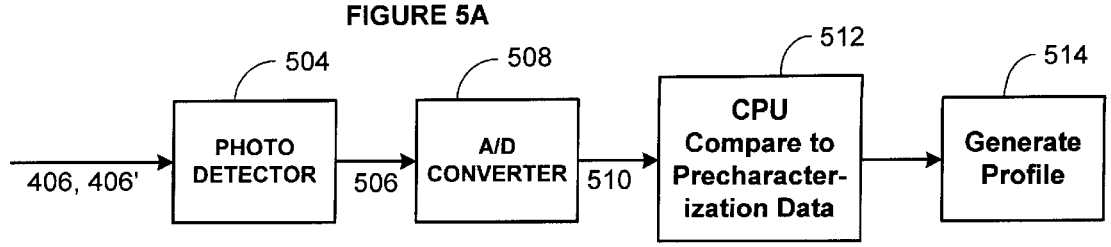
FIG. 5B is an abbreviated flow diagram illustrating the method of generating profiles of vias or trenches.
Figure 5C:
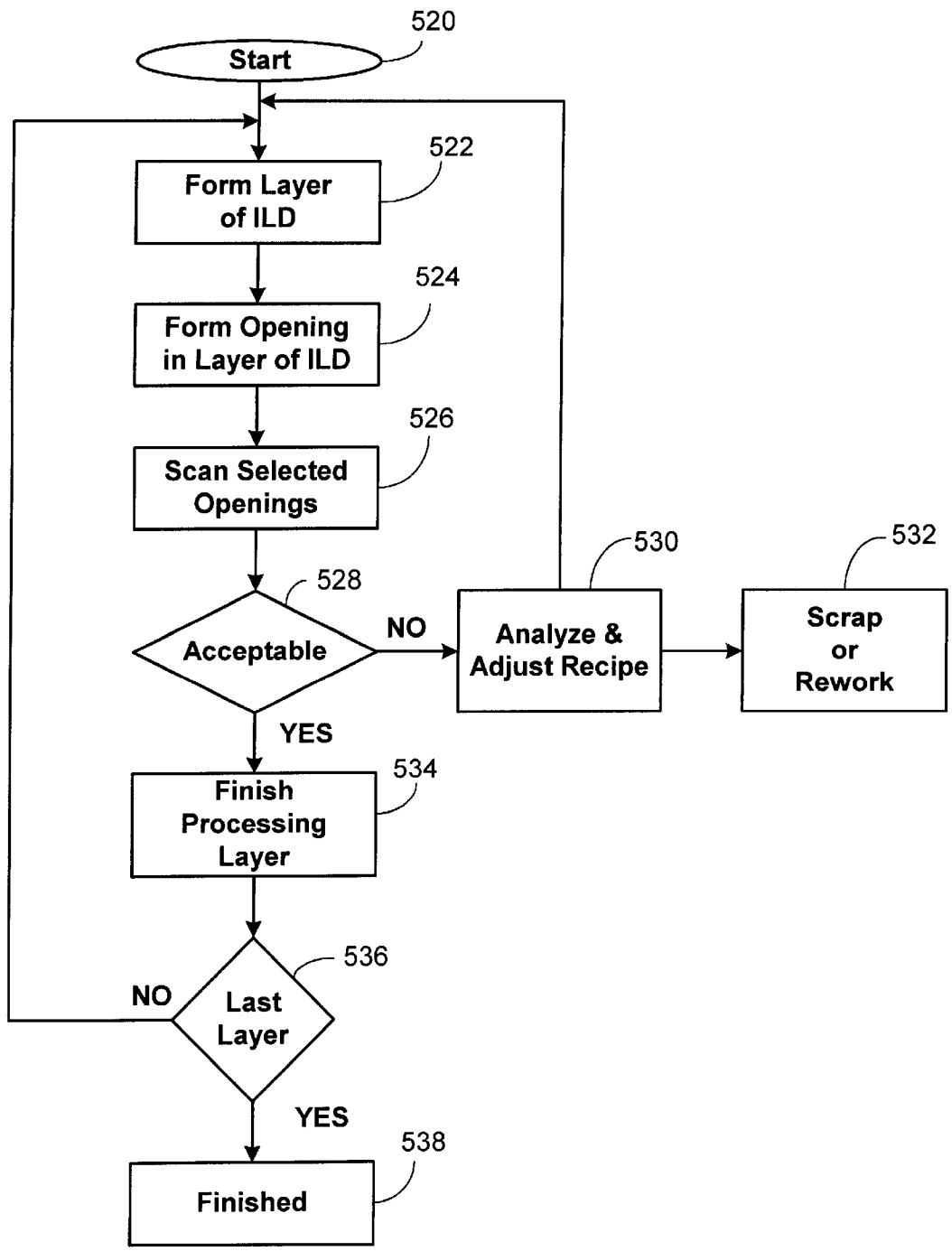
FIG. 5C is a flow diagram of a semiconductor manufacturing process including the scanning on unfilled openings in a layer of a semiconductor device in accordance with the present invention.

FIG. 5C is a flow diagram of a portion of a manufacturing process that includes scanning unfilled openings in a layer of a semiconductor device to determine depth profiles. The portion of the manufacturing flow that will be discussed starts at 520. As should be appreciated, a substantial portion of the manufacturing process has been finished to this point. A layer of interlayer dielectric is formed on the surface of a semiconductor wafer at 522. Openings are formed in the layer of interlayer dielectric at 524 as described above in conjunction with FIGS. 2A–2O. Selected openings are scanned as described above at 526. It is determined at 528 if the openings are acceptable. If the openings are not acceptable, the data is analyzed and the manufacturing recipe can be adjusted at 530 to correct the process recipe so that the openings would be acceptable. After the defective devices have been analyzed at 530 they are either scrapped or reworked at 532.

If it is determined at 528 that the devices are acceptable, processing the layer is finished as indicated at 534. After the layer is finished at 534, it is determined at 536 if the layer just finished is the last layer. If it is determined at 536 that the layer just finished is the last layer the device is finished as indicated at 538. If it is determined at 536 that the layer just finished is not the last layer, the process flow is sent to 522 where the next layer of ILD is formed on the semiconductor wafer and the process just described is repeated.

Figure 5D:
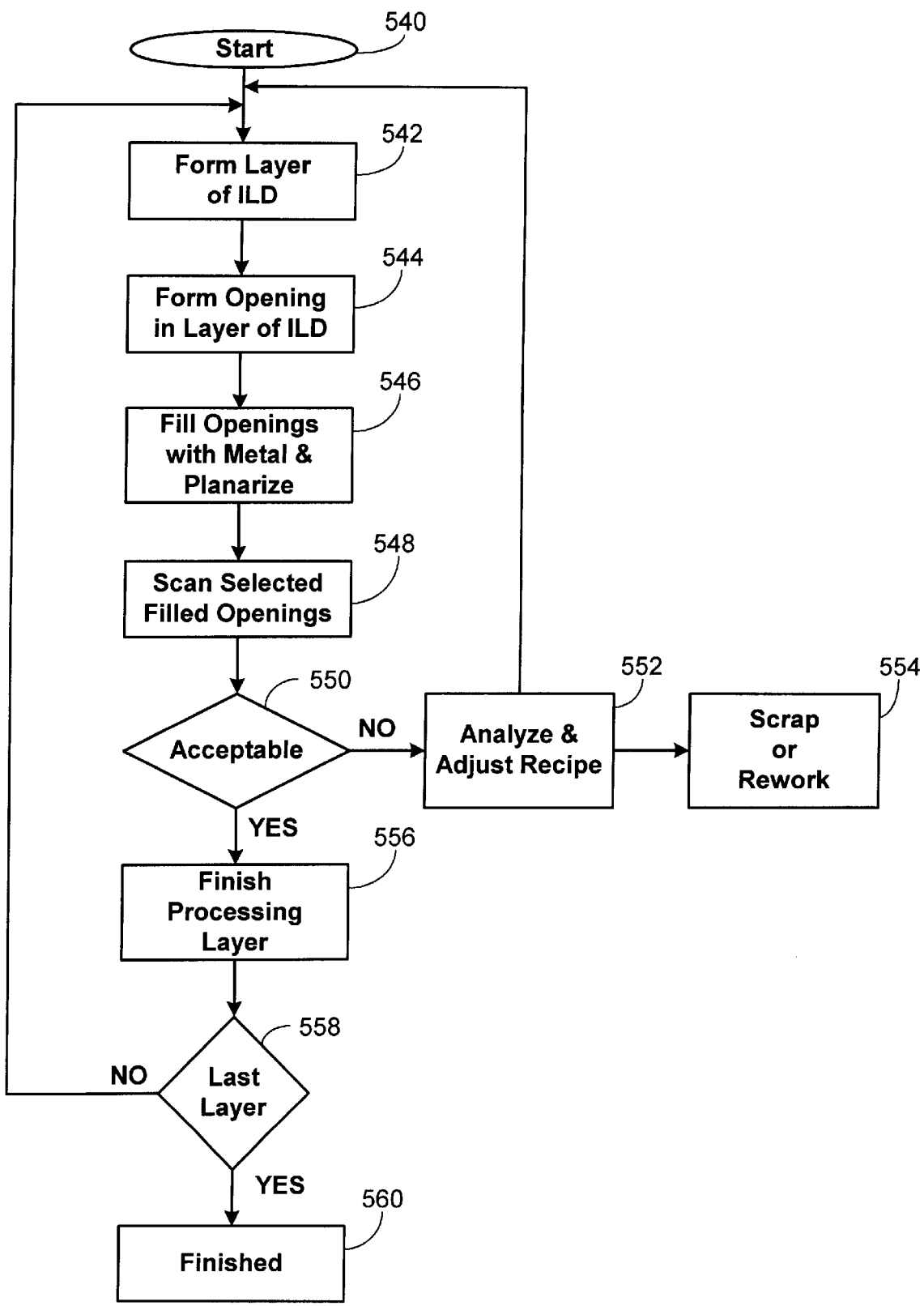
FIG. 5D is a flow diagram of a semiconductor manufacturing process including the scanning unfilled openings in a layer of a semiconductor device in accordance with the present invention.

FIG. 5D is a flow diagram of a portion of a manufacturing process that includes scanning openings in a layer of a semiconductor device that have been filled with a metal to determine depth profiles of the metal in the opening. The portion of the manufacturing flow that will be discussed starts at 540. As should be appreciated, a substantial portion of the manufacturing process has been finished to this point. A layer of interlayer dielectric is formed on the surface of a semiconductor wafer at 542. Openings are formed in the layer of interlayer dielectric at 544 as described above in conjunction with FIGS. 2A–2O. The openings are filled with a metal and planarized at 546. Selected openings that have been filled with metal are scanned as described above at 548. It is determined at 550 if the metal structures filling the openings are acceptable. If the metal structures are not acceptable, the data is analyzed and the manufacturing recipe can be adjusted at 552 to correct the process recipe so that the metal structures would be acceptable. After the defective devices have been analyzed at 552 they are either scrapped or reworked at 554.

If it is determined at 550 that the devices are acceptable, processing the layer is finished as indicated at 556. After the layer is finished at 556, it is determined at 558 that the layer just finished is the last layer the device is finished as indicated at 560. If it is determined at 558 that the layer just finished is not the last layer, the process flow is sent to 542 where the next layer of ILD is formed on the semiconductor wafer and the process just described is repeated.

Figures 6A, 6B:
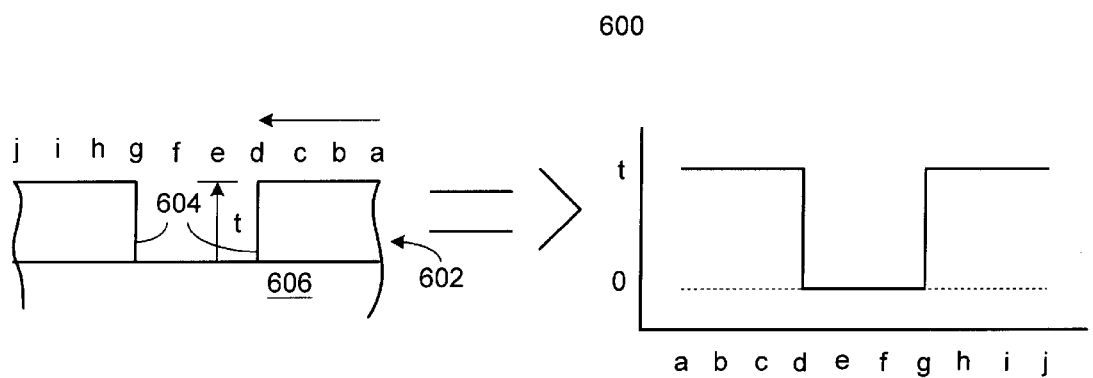
FIG. 6A shows a cross-section of an unfilled trench or via having an ideal cross-sectional profile and FIG. 6B shows a thickness profile of FIG. 6A generated by the profile generating technique of the present invention.

FIGS. 6A through 9B show various conditions of an opening formed in a layer of interlayer dielectric. FIG. 6A shows an opening 600 formed in a layer of interlayer dielectric 602. The opening 600 is an ideal opening in that the walls 604 are vertical thus providing the maximum area at the interface with the layer 606 underlying the opening 600. It should be appreciated that the area at the interface will be the contact area between the metal structure in the opening and the underlying metal structure or electrode. FIG. 6B shows the profile that is generated at 514 (FIG. 5B). The letters a through j in this figure and the figures that follow are for reference purposes to correlate the generated profile with the structure shown in FIG. 6A.

Figures 7A, 7B:
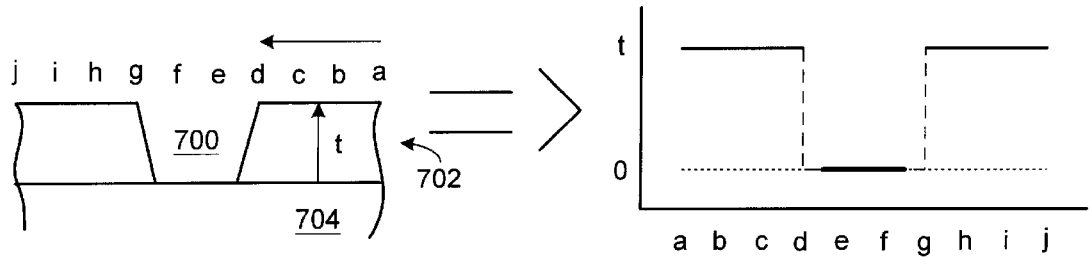
FIG. 7A shows a cross-section of an unfilled trench or via having a marginally acceptable cross-sectional profile and FIG. 7B shows a thickness profile of FIG. 7A generated by the profile generating technique of the present invention.

FIG. 7A shows an opening 700 formed in a layer of interlayer dielectric 702. The opening 700 is less than an ideal opening and is probably acceptable in that the contact area at the interface with the layer 704 underlying the opening 700 is not substantially decreased and may suffice as an adequate electrical contact. FIG. 7B shows the profile that is generated at 514 (FIG. 5B).

Figures 8A, 8B:
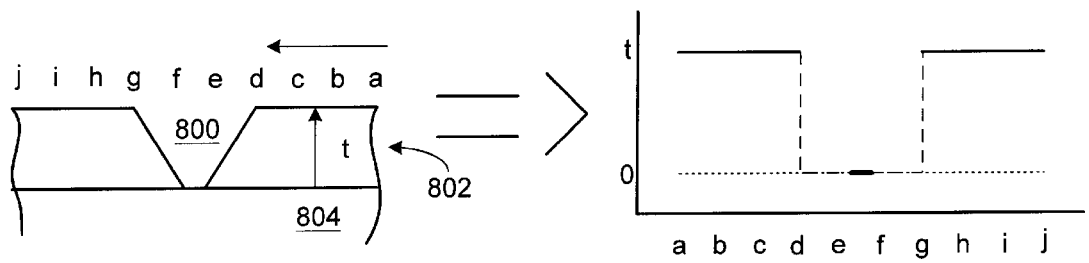
FIG. 8A shows a cross-section of an unfilled trench or via having an unacceptable cross-sectional profile and FIG. 8B shows a thickness profile of FIG. 8A generated by the profile generating technique of the present invention.

FIG. 8A shows an opening 800 formed in a layer of interlayer dielectric 802. The opening 800 is less than an ideal opening and is probably unacceptable in that the contact area at the interface with the layer 804 is minimal and would not suffice as an adequate electrical contact. FIG. 8B shows the profile that is generated at 514 (FIG. 5B).

Figures 9A, 9B:
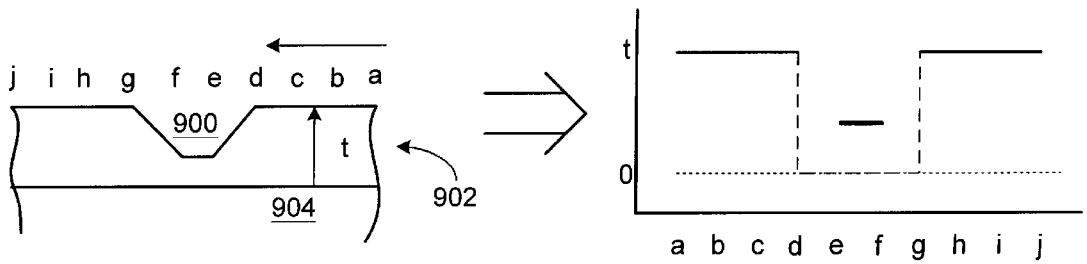
FIG. 9A shows a cross-section of an unfilled trench or via having an unacceptable cross-sectional profile and FIG. 9B shows a thickness profile of FIG. 9A generated by the profile generating technique of the present invention.

FIG. 9A shows an opening 900 formed in a layer of interlayer dielectric 902. The opening 900 does not extend down to the interface with the layer 904 underlying the interlayer dielectric 902. Because the opening 900 does not extend down to the interface there will be no electrical contact between the metal structure formed in the layer 902 of interlayer dielectric and the metal structure formed in the layer 904.

Figures 10A, 10B:
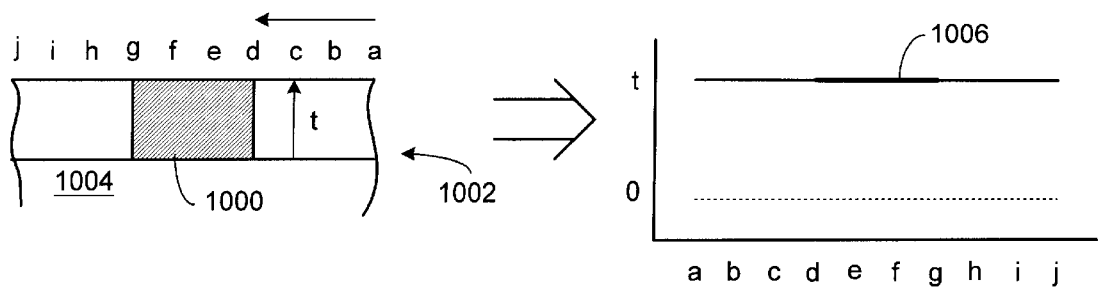
FIG. 10A shows a cross-section of a filled trench or via having an ideal cross-sectional profile and FIG. 10B shows a thickness profile of FIG. 10A generated by the profile generating technique of the present invention.

FIG. 10A through 13B show various conditions metal structures formed in openings formed in interlayer dielectric. FIG. 10A shows a metal structure 1000 formed in a layer 1002 of interlayer dielectric. The metal structure 1000 as shown provides the maximum contact area between the metal structure 1000 and the metal structure formed in the layer 1004 underlying the metal structure 1000. FIG. 10B shows the profile that is generated at 514 (FIG. 5B). The portion of the profile 1006 indicates the extent of the contact.

Figures 11A, 11B:
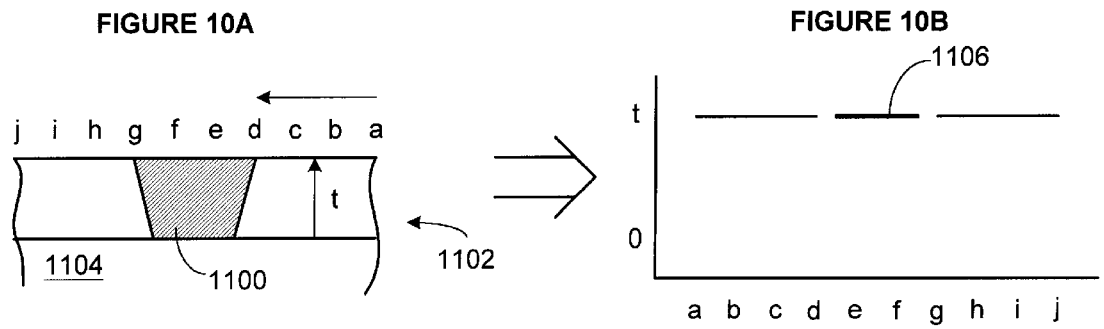
FIG. 11A shows a cross-section of a filled trench or via having a marginally acceptable cross-sectional profile and FIG. 11B shows a thickness profile of FIG. 11A generated by the profile generating technique of the present invention.

FIG. 1A shows a metal structure 1100 formed in a layer 1102 of interlayer dielectric. The metal structure 1100 as shown provides a contact less than the ideal and is probably acceptable in that the contact area is not substantially less than the ideal and may suffice as an adequate electrical contact. FIG. 11B shows the profile that is generated at 514 (FIG. 5B). The portion of the profile 1106 shows that the contact does not extend to the maximum extent although it does make contact with the underlying layer.

Figures 12A, 12B:
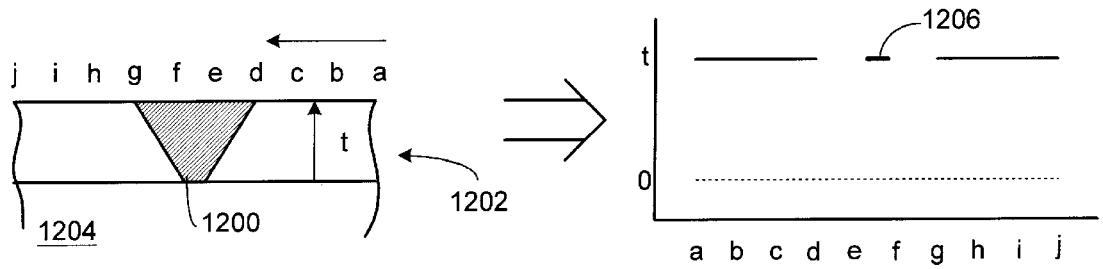
FIG. 12A shows a cross-section of a filled trench or via having an unacceptable cross-sectional profile and FIG. 12B shows a thickness profile of FIG. 12A generated by the profile generating technique of the present invention.

FIG. 12A shows a metal structure 1200 formed in a layer 1202 of interlayer dielectric. The metal structure 1200 as shown provides only a minimal contact with the underlying layer 1204 and is probably unacceptable in that the contact area would not suffice as an adequate electrical contact. FIG. 12B shows the profile that is generated at 514 (FIG. 1B). The portion of the profile 1206 shows that the contact is minimal although it does make contact with the underlying layer.

Figures 13A, 13B:
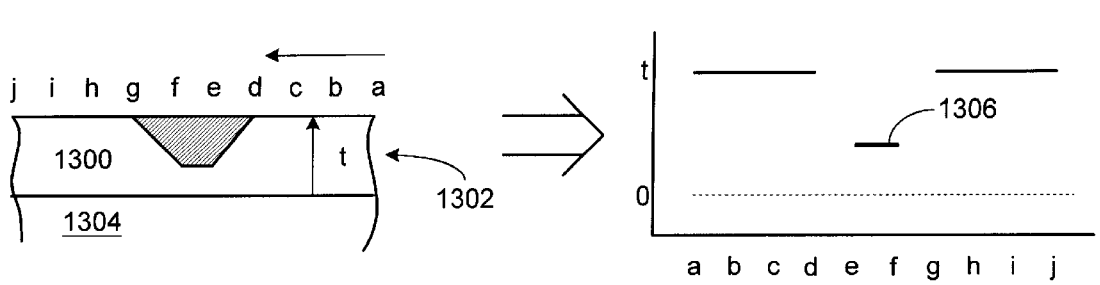
FIG. 13A shows a cross-section of a filled trench or via having an unacceptable cross-sectional profile and FIG. 13B shows a thickness profile of FIG. 13B generated by the profile generating technique of the present invention.

FIG. 13A shows an opening 1300 formed in a layer 1302 of interlayer dielectric. The metal structure 1300 as shown does not provide any contact with the underlying layer 1304 and as such does not provide any electrical contact. FIG. 13B shows the profile that is generated at 514B (FIG. 5B). The portion of the profile 1306 shows that there is no contact with the underlying area and that the thickness is less than the desired thickness t.

In summary, the results and advantages of the methods of the present invention can now be more fully realized. The method of monitoring filled or unfilled trenches and vias during the manufacturing process saves valuable resources and results in less scrap.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, wherein the method comprises:

(a) forming a layer of an interlayer dielectric on a surface of the semiconductor device;

(b) forming at least one opening in the layer of interlayer dielectric; and (c) non-destructively determining the profile of the at least one opening in tile layer of interlayer dielectric by:

scanning the at least one opening with two excitation pulses, wherein the excitation pulses are overlapped in time and space so that they interfere to form a spatially and temporally varying excitation radiation field that excites acoustic waveguide modes that have a wavelength and orientation corresponding to an excitation wavevector that occurs via impulsive simulated thermal scattering that causes a time-dependent ripple to be generated, wherein the frequency of the ripple oscillations is dependent on the thickness of the film;

irradiating the ripple by a probe pulse that diffracts to form at least two signal beams, wherein the at least two signal beams are modulated in accordance to the time dependence of the acoustic waveguide modes;

detecting one of the at least two signal beams;

generating a light-induced signal that is digitized by an a/d converter to produce a digitized waveform signal;

analyzing the digitized waveform signal in a CPU;

obtaining a frequency of the digitized waveform signal; and comparing the digitized waveform signal to characterization waveforms stored in a database to determine the profile of the at least one opening.

2. The method of claim 1 further comprising:

(d) determining if the profile of the at least one opening is acceptable; and (e) continuing processing the semiconductor device if the profile is acceptable.

3. The method of claim 2 wherein steps (a) and (b) are accomplished in accordance with a manufacturing recipe.

4. The method of claim 3 further comprising:

(f) analyzing the profile of the at least one opening if the profile of the opening is determined to be unacceptable during step (d); and (g) adjusting the manufacturing recipe in accordance with the analysis in step (f).

5. A method of manufacturing a semiconductor device, wherein the method comprises:

(a) forming a layer of an interlayer dielectric on a surface of the semiconductor device;

(b) forming at least one opening in the layer of interlayer dielectric;

(c) filling the at least one opening in the layer of interlayer dielectric with a metal to form at least one metal structure; and (d) non-destructively determining the profile of the at least one metal structure by:

scanning the at least one metal structure with two excitation pulses, wherein the excitation pulses are overlapped in time and space so that they interfere to form a spatially and temporally varying excitation radiation field that excites acoustic waveguide modes that have a wavelength and orientation corresponding to an excitation wavevector that Occurs via impulsive stimulated thermal scattering that causes a time-dependent ripple to be generated, wherein the frequency of the ripple oscillations is dependent on the thickness of the film;

irradiating the ripple by a probe pulse that diffracts to form at least two signal beams, wherein the at least two signal beams are modulated in accordance to the time dependence of the acoustic waveguide modes;

detecting one of the at least two signal beams;

generating a light-induced signal that is digitized by an a/d converter to produce a digitized waveform signal;

analyzing the digitized waveform signal in a CPU;

obtaining a frequency of the digitized waveform signal; and comparing the digitized waveform signal to characterization waveforms stored in a database to determine the profile of the at least one metal structure.

6. The method of claim 5 further comprising:

(e) determining if the profile of the at least one metal structure is acceptable; and (f) continuing processing the semiconductor device if the profile of the at least one metal structure is acceptable.

7. The method of claim 6 wherein steps (a), (b) and (c) are accomplished in accordance with a manufacturing recipe.

8. The method of claim 7 further comprising:

(g) analyzing the profile of the at least one metal structure if the profile of the at least one metal structure is determined to be unacceptable during step (e); and (h) adjusting the manufacturing recipe in accordance with the analysis in step (g).

* * * * *